United States Patent [19]

Uehara et al.

[11] Patent Number: 5,491,440
[45] Date of Patent: Feb. 13, 1996

[54] AUTOMATIC CLOCK DUTY CYCLE ADJUSTING CIRCUIT

[75] Inventors: Takafumi Uehara; Masayoshi Dehara, both of Tokyo, Japan

[73] Assignee: Ando Electric Co., Ltd., Tokyo, Japan

[21] Appl. No.: 393,286

[22] Filed: Feb. 23, 1995

[30] Foreign Application Priority Data

Mar. 16, 1994 [JP] Japan .................................. 6-071470

[51] Int. Cl.[6] ..................................................... H03K 5/08
[52] U.S. Cl. .......................................... 327/172; 327/175
[58] Field of Search ..................................... 327/172, 175

[56] References Cited

U.S. PATENT DOCUMENTS 5,418,485  5/1995  Duret et al. ............................. 327/172

*Primary Examiner*—Margaret Rose Wambach
*Attorney, Agent, or Firm*—Flynn, Thiel, Boutell & Tanis

[57] ABSTRACT

A circuit for automatically adjusting duty cycle of an output clock signal is provided. The circuit comprises a monostable multivibrator for receiving an input clock signal at its clock terminal and outputting an output clock signal, a frequency dividing circuit for dividing down the input clock signal by 1/N, an inverter for inverting an output of the frequency dividing circuit, an integrating circuit for receiving the output clock signal, a comparator for receiving an output of the integrating circuit and a reference voltage corresponding to a desired duty cycle, a D-type flip-flop for receiving an output of the comparator at its data terminal and an output of the inverter at its clock terminal, an AND gate for receiving an inverse output of the D-type flip-flop and the output of the frequency dividing circuit, and a counter for receiving a reset signal at its reset terminal and an output of the AND gate at its clock terminal, and for counting a set data which is input to the monostable multivibrator, wherein the monostable multivibrator outputs the output clock signal having a pulse width corresponding to the set data.

1 Claim, 5 Drawing Sheets

FIG. 3
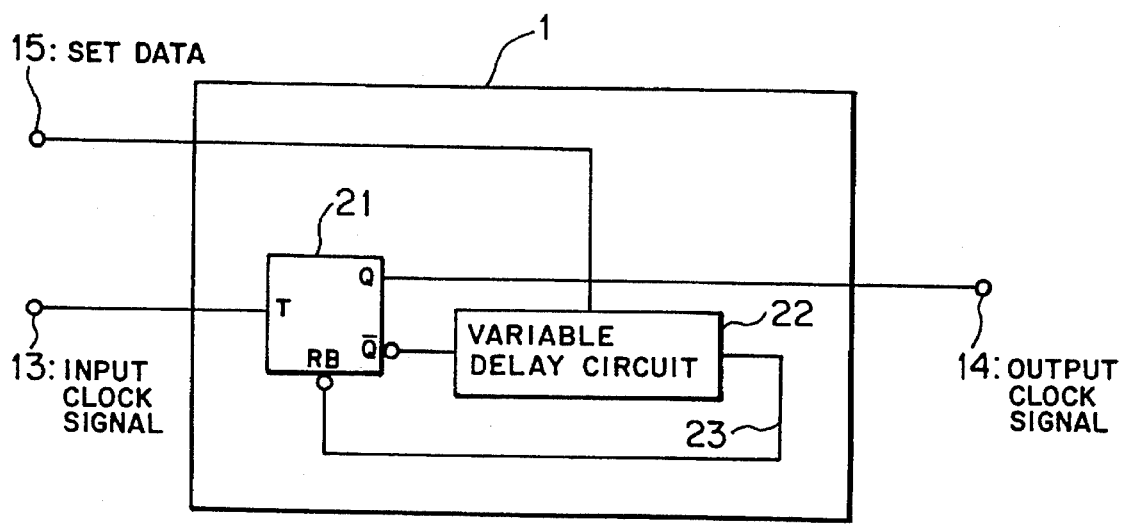
FIG. 4(A)
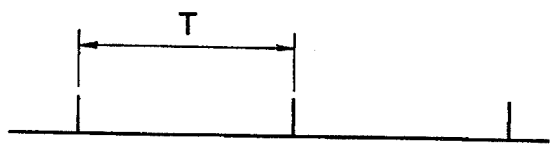
FIG. 4(B)
FIG. 4(C)
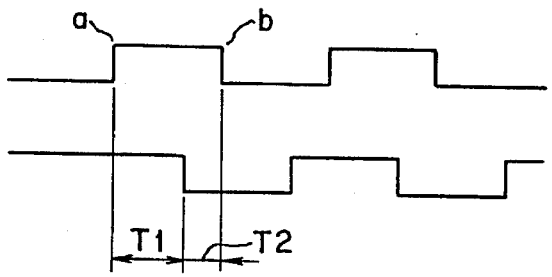

FIG. 7
PRIOR ART
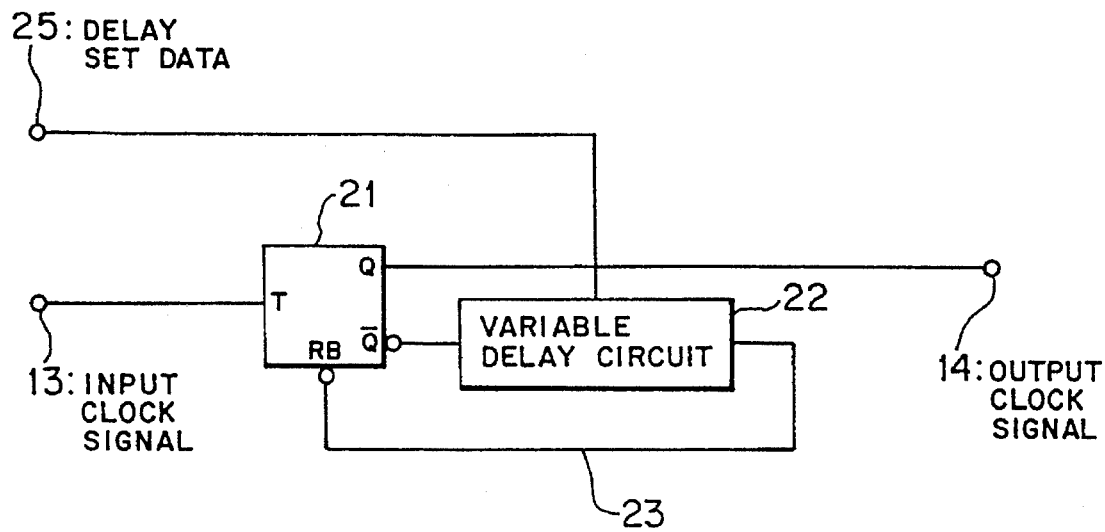
FIG. 8(A) PRIOR ART
FIG. 8(B) PRIOR ART
FIG. 8(C) PRIOR ART
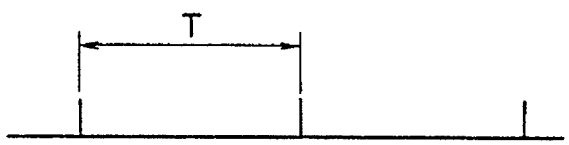
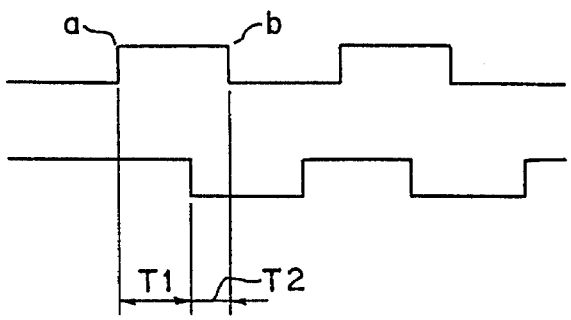

AUTOMATIC CLOCK DUTY CYCLE ADJUSTING CIRCUIT

BACKGROUND OF THE INVENTION

1. Field of the Invention

The present invention relates to a circuit for automatically adjusting duty cycle of a clock signal to be used in a logical circuit (hereinafter referred to as an automatic clock duty cycle adjusting circuit).

2. Prior Art

An arrangement of a prior art automatic clock duty cycle adjusting circuit will be now described with reference to FIG. 7. In FIG. 7, denoted at 21 is a T-type flip-flop (hereinafter referred to as a T-FF) and 22 is a variable delay circuit. An input clock signal 13 is connected to a clock terminal T of the T-FF 21. An inverse output which is output from an output terminal Q of the T-FF 21 is connected to a reset terminal RB of the T-FF 21 by way of the variable delay circuit 22. A set data 25 is given to the variable delay circuit 22 from an external device.

FIG. 8 is a timing chart showing an operation of the automatic clock duty cycle adjusting circuit of FIG. 7. FIG. 8(A) shows a waveform of the input clock signal 13, FIG. 8(B) shows a waveform of an output clock signal 14 of the T-FF 21 and FIG. 8(C) shows a waveform of an output 23 of the variable delay circuit 22.

In FIG. 7, when a leading edge of the input clock signal 13 of FIG. 8 (A) is input to the clock terminal T of the T-FF 21, the output clock signal 14 to be output from the output terminal Q of the T-FF 21 is changed from an "L" level to an "H" level as denoted at a in FIG. 8(B). The inverse output of the T-FF 21 is input to the reset terminal RB of the same while it is delayed by the variable delay circuit 22 by the time corresponding to the delay set data 25. As a result, the output of the T-FF 21 is changed from the "H" level to the "L" level as denoted at b in FIG. 8(B). In FIG. 8(C), the time corresponding to the delay set data 25 is T1.

As mentioned above, a positive pulse width of the output clock signal 14 is the sum of the delay time T1 of the variable delay circuit 22 and an operation delay time T2 which is taken from the reset terminal RB to the output terminal Q of the T-FF 21. Accordingly, when the delay time T1 of the variable delay circuit 23 is varied by the delay set data 25, the duty cycle of the output clock signal 14 is varied in response thereto. As a result, supposing that a period of the output clock signal 14 is T, the duty cycle is expressed as (T1+T2)T×100 (%).

However, there is the following drawback in the prior art automatic clock duty cycle adjusting circuit. In order to adjust the duty cycle of the output clock signal 14 by varying the time set data 25 of the variable delay circuit 22, it is necessary to vary the delay set data 25 of the variable delay circuit 22 while monitoring a waveform of the output clock signal 14 from the FF-21 by an oscilloscope, etc.

SUMMARY OF THE INVENTION

It is an object of the invention to provide an automatic clock duty cycle adjusting circuit which dispenses with a prior art manual adjustment of the duty cycle of the output clock signal.

To achieve the above object, the automatic clock duty cycle adjusting circuit comprises a monostable multivibrator for receiving an input clock signal at its clock terminal and outputting an output clock signal, a frequency dividing circuit for dividing down the input clock signal by 1/N, an inverter for inverting an output of the frequency dividing circuit, an integrating circuit for receiving the output clock signal, a comparator for receiving an output of the integrating circuit and a reference voltage corresponding to a desired duty cycle, a D-type flip-flop for receiving an output of the comparator at its data terminal and an output of the inverter at its clock terminal, an AND gate for receiving an inverse output of the D-type flip-flop and the output of the frequency dividing circuit, and a counter for receiving a reset signal at its reset terminal and an output of the AND gate at its clock terminal, and for counting a set data which is input to the monostable multivibrator, wherein the monostable multivibrator outputs the output clock signal having a pulse width corresponding to the set data.

BRIEF DESCRIPTION OF THE DRAWINGS

FIG. 3 is a circuit diagram showing an arrangement of a monostable multivibrator;

FIGS. 4(A), (B) and (C) are waveforms showing an operation of the arrangement of FIG. 3;

FIG. 7 is a circuit diagram showing an arrangement of a prior art automatic clock duty cycle adjusting circuit; and FIGS. 8(A), 8(B) and 8(C) are timing charts showing an operation of the arrangement of FIG. 7.

PREFERRED EMBODIMENT OF THE INVENTION

An automatic clock duty cycle adjusting circuit will be now described with reference to FIGS. 1 to 6.

Figure 1:
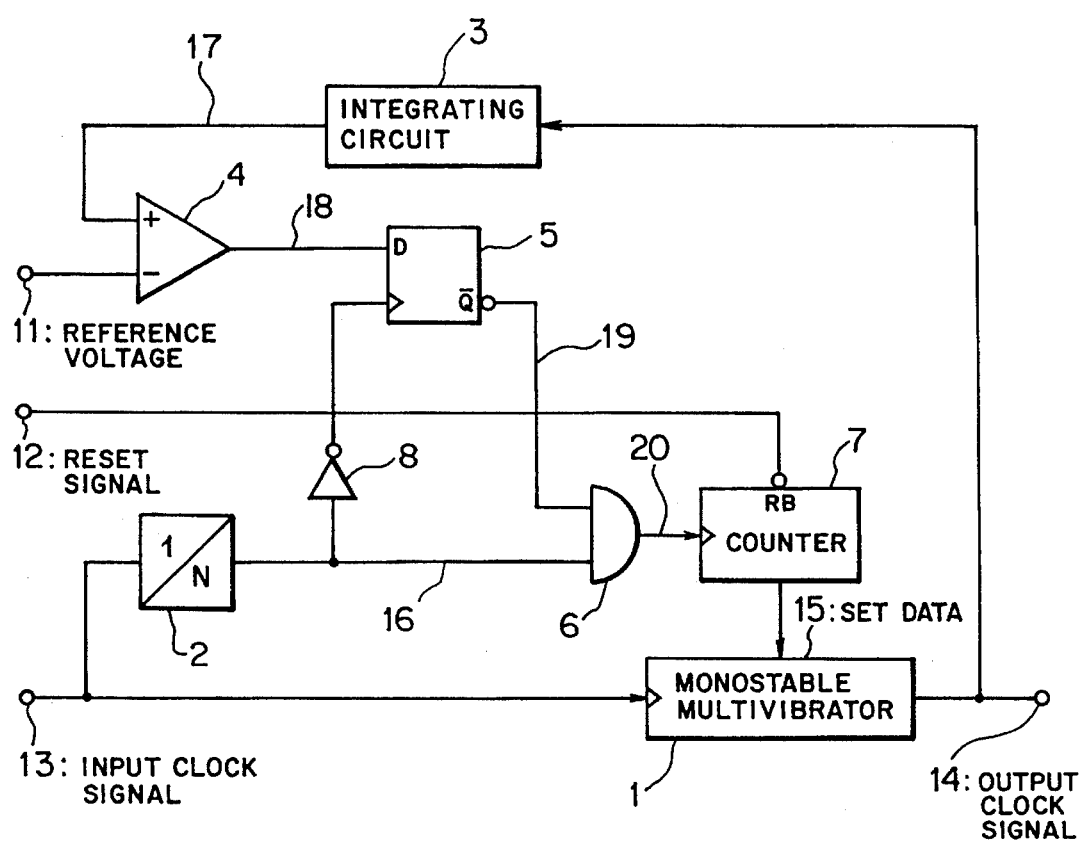
FIG. 1 is a circuit diagram showing an arrangement of an automatic clock duty cycle adjusting circuit according to the present invention.

In FIG. 1, an input clock signal 13 is input to a monostable multivibrator 1 and also to a frequency dividing circuit 2 when a leading edge of the input clock signal 13 is input to the monostable multivibrator 1. The monostable multivibrator 1 outputs an output clock signal 14 having an arbitrary pulse width which is determined by a value of a set data 15. Fig. 1 shows an arrangement of the automatic clock duty cycle adjusting circuit, which exemplifies a case where the positive pulse width of the output clock signal widens as the set data 15 becomes large.

The frequency dividing circuit 2 divides down the input clock signal 13 by 1/N (N is natural number). An output 16 of the frequency dividing circuit 2 is input to a first input of an AND gate 6, and it is inverted by an inverter 8 and is transmitted to a clock terminal of a D-FF 5. An integrating circuit 3 receives an output clock signal 14 and integrates the output clock signal 14 during the period of clock signal having the 1/N frequency. A comparator 4 receives an output signal 17 of the integrating circuit 3 and a reference voltage 11 corresponding to a desired duty cycle and compares them. An output 18 of the comparator 4 is input to a data terminal of the D-FF 5.

The D-FF 5 receives the output 18 of the comparator 4 at its data terminal and an output of the inverter 8 at its clock terminal, and outputs an inverse output 19 to the AND gate 6. The AND gate 6 receives the output 16 of the frequency dividing circuit 2 at its first input and the inverse output 19 of the D-FF 5 at its second input, and outputs an output 20 to a clock terminal of a counter 7. The counter 7 receives a reset signal 12 at its reset terminal and outputs the set data 15 to the monostable multivibrator 1 in with a timing of the output 20 of the AND gate 6.

The counter 7 counts in an ascending order, namely, performs a count-up in response to a clock which is divided down into 1/N frequency. Since the set data 15 which is input to the monostable multivibrator 1 is the output of the counter 7, the positive pulse width of the output clock signal 14 widens every time the counter 7 performs the count-up. When the output signal 17 of the integrating circuit 3 exceeds the reference voltage 11 corresponding to the desired duty cycle, the output 16 having 1/N clock from the frequency dividing circuit 2 is masked by the AND gate 6, and the counter 7 stops counting, whereby the clock signal having the desired duty cycle is obtained.

FIG. 2 is a timing chart showing each operation of each component of the arrangement of FIG. 1. FIG. 2(A) shows a waveform of the reset signal 12, FIG. 2(B) shows a waveform of the input clock signal 13 and FIG. 2(C) shows a waveform of the output 16 of the frequency dividing circuit 2. FIG. 2(D) shows a waveform of the set data 15 of the counter 7, FIG. 2(E) shows a waveform of the output clock signal 14 and FIG. 2(F) shows a waveform of the output signal 17 of the integrating circuit 3. FIG. 2(G) shows a waveform of the output signal 18 from the comparator 4, FIG. 2(H) shows a waveform of the inverse output 19 output from the output terminal Q of the D-FF 5 and FIG. 2(I) shows a waveform of the output 20 of the AND gate 6.

An operation of the arrangement of the automatic clock duty cycle adjusting circuit will be now described with reference to FIG. 2.

The counter 7 in FIG. 1 is reset by the reset signal 12 so that the output thereof is changed to an "L" level. The monostable multivibrator 1 outputs a clock signal having the positive narrowest pulse width as shown in FIG. 2(B).

Figure 2A:
FIGS. 2(A), 2(B), 2(C), 2(D), 2(E), 2(F), 2(G), 2(H) and 2(I) are timing charts showing an operation of the arrangement of FIG. 1.
Figure 2B:
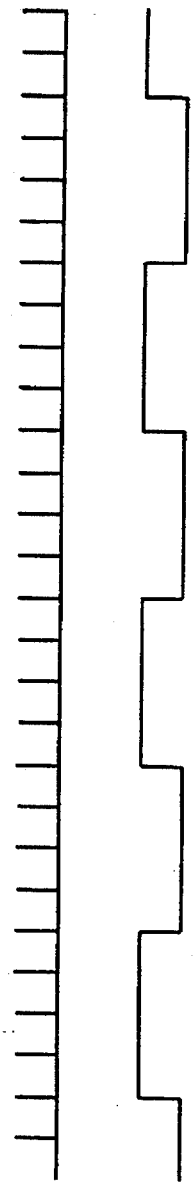
Figure 2C:
Figure 2D:
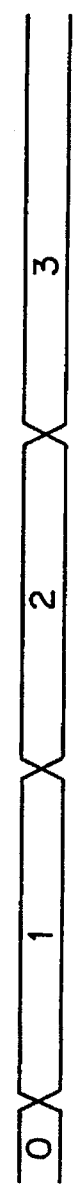

As shown in FIG. 2(A), when the reset signal 12 is reset, the counter 7 starts to perform the count-up by the signal which is obtained by dividing down the input clock signal 13 as shown in FIG. 2(C). FIG. 2(C) shows a waveform of the output 16 of the frequency dividing circuit 2, which is divided down into ¼ frequency.

Figure 2E:

Since the monostable multivibrator 1 receives the output of the counter 7 as the set data 15, the positive pulse width of the output clock signal 14 widens as shown in FIG. 2(E) when the counter 7 starts to count up.

The integrating circuit 3 receives the output clock signal 14 so that the output level thereof is increased. The output 17 of the integrating circuit 3 is compared with the reference voltage 11 corresponding to the desired duty cycle by the comparator 4. Denoted at A in FIG. 2(F) shows a waveform of the output level of the integrating circuit 3 and B is a waveform of the reference voltage 11.

Figure 2F:
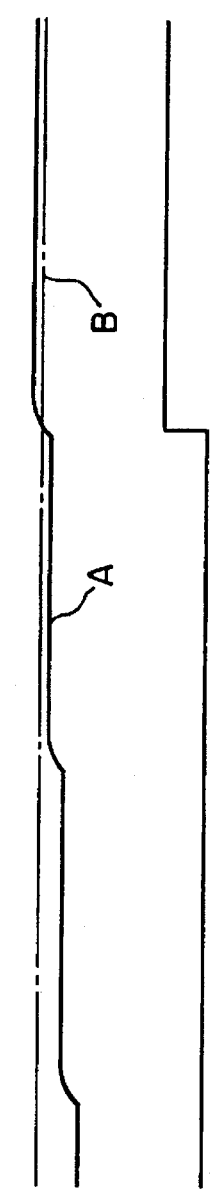
Figure 2G:
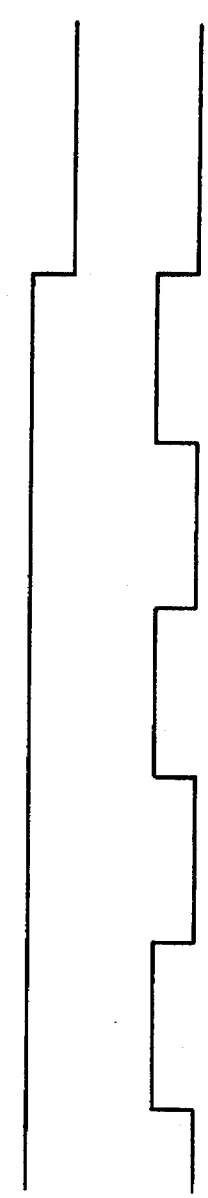
Figure 2H:
Figure 2I:

In FIG. 2(F), if the output 17 of the integrating circuit 3 is less than the reference voltage 11 corresponding to the desired duty cycle, the output 18 of the comparator 4 becomes the "L" level. The "L" level of the comparator 4 is latched by the D-FF 5 and an "H" level of the inverse output 19 from the output terminal Q of the D-FF 5 is transmitted to the AND gate 6. While the inverse output 19 of the D-FF 5 is under the "H" level, the output 16 of the frequency dividing circuit 2 becomes the output 20 of the AND gate 6 as it is and the counter 7 counts up. These operations are repeated.

In FIG. 2(F), if the output 17 of the integrating circuit 3 is greater than the reference voltage 11 corresponding to the desired duty cycle, the output of the comparator 4 becomes the "H" level. The "H" level of the output 18 of the comparator 4 is latched by the D-FF 5 and the "L" level of the inverse output 19 is transmitted from the output terminal Q of the DFF-5 to the AND gate 6. As a result, the output 16 of the frequency dividing circuit 2 is masked and the output 20 of the AND gate 6 is fixed to the level. Accordingly, the counter 7 stops and the set data 15 to be input to the monostable multivibrator 1 is fixed, whereby the clock signal having the desired duty cycle is obtained.

FIG. 3 is a circuit diagram showing an arrangement of the monostable multivibrator 1. Denoted at 21 is a T-FF, 22 is a variable delay circuit. The arrangement of the monostable multivibrator 1 in FIG. 3 is the same as the prior art duty cycle adjusting circuit in FIG. 7. However, the delay set data 25 in FIG. 7 to be input to the variable delay circuit 22 is set manually, whereas a set data 15 is output by the counter 7.

An operation of the monostable multivibrator 1 in FIG. 3 will be now described with reference to FIG. 4. Waveforms showing the operation of the monostable multivibrator 1 in FIG. 3 are the same as those in FIG. 7. As shown in FIG. 4(A), when the input clock signal 13 is input to the T-FF 21, the output 14 of the T-FF 21 is changed to an "H" level as denoted at a in FIG. 4(B). An inverse output of the T-FF 21 is input to the variable delay circuit 22 and is output from the variable delay circuit 22 while it is delayed by the time T1. An output 23 of the variable delay circuit 22 is input to a reset terminal RB of the T-FF 21 and the output 14 of the T-FF 21 is changed to an "L" level as denoted at b in FIG. 4(B) while it is delayed by the time T2.

As a result, the positive pulse width of the output clock signal 14 becomes T1+T2 and the duty cycle thereof becomes (T1+T2)/T×100 (%), where T is a period of the output clock signal.

Figure 5:
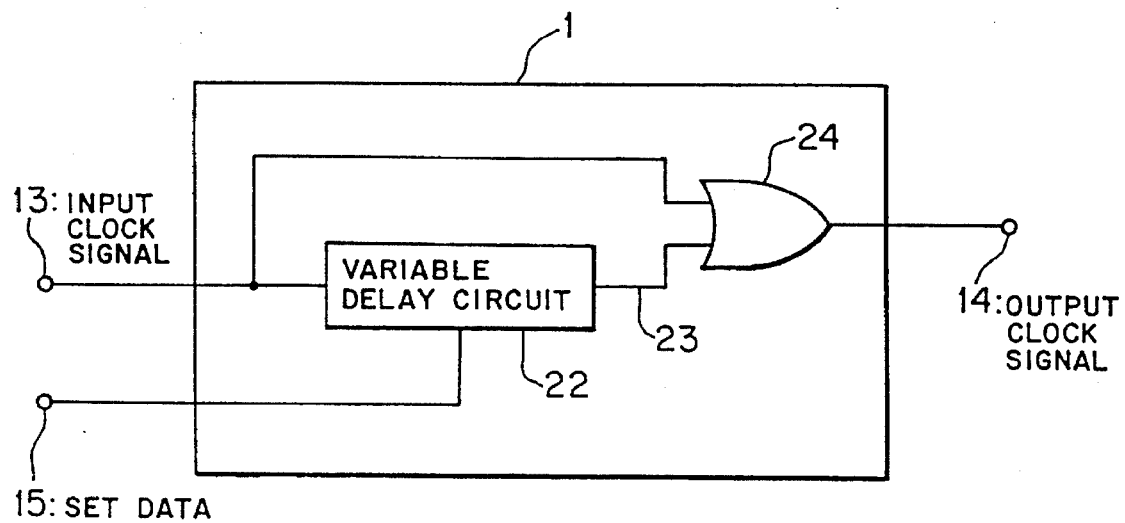
FIG. 5 is a circuit diagram showing another arrangement of a monostable multivibrator.

FIG. 5 is a circuit diagram showing an arrangement of another monostable multivibrator.

Denoted at 24 is an OR gate. When the variable delay circuit 22 receives an input clock signal 13, it outputs an output thereof to the 0R gate 24 by the time corresponding to the set data 15. The OR gate 24 receives the input clock signal 13 and the output 23 of the variable delay circuit 22 and outputs an output clock signal 14.

Figure 6A:
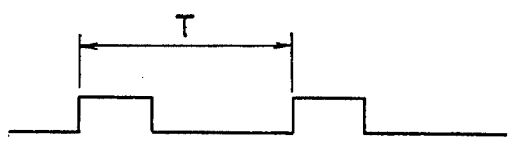
FIGS. 6(A), (B) and (C) are waveforms showing an operation of the arrangement of FIG. 5.
Figure 6B:
Figure 6C:

An operation of the monostable multivibrator 1 in FIG. 5 will be now described with reference to FIG. 6. As shown in FIG. 6(A), the input clock signal 13 is input to the variable delay circuit 22 and is output from the variable delay circuit 22 while is delayed by the time T3 as shown in FIG. 6 (B). The input clock signal 13 and the output 23 of the variable delay circuit 22 are ORed, whereby the output clock signal 14 is obtained as shown in FIG. 6(C). Supposing that the input clock signal 13 has a positive pulse width of T4, and a period of T, the duty cycle thereof becomes (T3+T4)/T× 100 (%).

According to the present invention, it is possible to automatically set the duty cycle of the clock signal without resorting to a manual adjustment by previously setting the reference voltage corresponding to the desired duty cycle.

What is claimed is:

1. An automatic clock duty cycle adjusting circuit comprising:

a monostable multivibrator for receiving an input clock signal at its clock terminal and outputting an output clock signal;

a frequency dividing circuit for dividing down said input clock signal by 1/N;

an inverter for inverting an output of said frequency dividing circuit;

an integrating circuit for receiving said output clock signal;

a comparator for receiving an output of said integrating circuit and a reference voltage corresponding to a desired duty cycle;

a D-type flip-flop for receiving an output of said comparator at its data terminal and an output of said inverter at its clock terminal;

an AND gate for receiving an inverse output of said D-type flip-flop and said output of said frequency dividing circuit; and a counter for receiving a reset signal at its reset terminal and an output of said AND gate at its clock terminal, and for counting a set data which is input to said monostable multivibrator, wherein said monostable multivibrator outputs said output clock signal having a pulse width corresponding to said set data.

* * * * *